(12) United States Patent
Zheng et al.

(10) Patent No.: US 11,243,641 B2
(45) Date of Patent: Feb. 8, 2022

(54) DISPLAY DEVICE, TOUCH PANEL AND MANUFACTURING METHOD THEREOF

(71) Applicant: BOE TECHNOLOGY GROUP CO., LTD., Beijing (CN)

(72) Inventors: Meizhu Zheng, Beijing (CN); Lina Liu, Beijing (CN); Yuanyuan Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 101 days.

(21) Appl. No.: 16/197,501

(22) Filed: Nov. 21, 2018

(65) Prior Publication Data
US 2019/0155418 A1 May 23, 2019

(30) Foreign Application Priority Data

Nov. 22, 2017 (CN) .......................... 201711176018.7

(51) Int. Cl.
*G06F 3/041* (2006.01)
*G06F 3/044* (2006.01)
*H01L 51/52* (2006.01)
*H01L 27/32* (2006.01)

(52) U.S. Cl.
CPC ............ *G06F 3/044* (2013.01); *G06F 3/0412* (2013.01); *G06F 3/0443* (2019.05); *G06F 3/04164* (2019.05); *H01L 27/323* (2013.01); *H01L 51/5237* (2013.01); *G06F 3/0416* (2013.01); *G06F 2203/04103* (2013.01)

(58) Field of Classification Search
CPC .................................. G06F 3/041; G06F 3/044
See application file for complete search history.

(56) References Cited

U.S. PATENT DOCUMENTS

| 2010/0013800 | A1* | 1/2010 | Elias | G06F 3/0443 345/178 |
| 2010/0059294 | A1* | 3/2010 | Elias | G06F 3/044 178/18.06 |
| 2014/0160376 | A1* | 6/2014 | Wang | G02F 1/1343 349/12 |
| 2014/0204291 | A1* | 7/2014 | Kung | G06F 3/041 349/12 |
| 2014/0210784 | A1* | 7/2014 | Gourevitch | H03K 17/962 345/174 |
| 2016/0183382 | A1* | 6/2016 | Solven | G06F 3/0443 345/174 |
| 2017/0160833 | A1* | 6/2017 | Han | G06F 3/0416 |
| 2018/0006265 | A1* | 1/2018 | Oh | H01L 51/0017 |
| 2018/0033829 | A1* | 2/2018 | Oh | G06F 3/03547 |
| 2018/0308903 | A1* | 10/2018 | Jeong | H01L 51/5281 |

* cited by examiner

*Primary Examiner* — Chanh D Nguyen
*Assistant Examiner* — Nguyen H Truong
(74) *Attorney, Agent, or Firm* — Calfee, Halter & Griswold LLP

(57) ABSTRACT

A display device, a touch panel and a method for manufacturing the touch panel. The touch panel of the present disclosure includes a substrate, a plurality of first touch electrodes, and a plurality of second touch electrodes. The first touch electrodes are arranged on the substrate. The second touch electrodes are arranged in the same layer as the first touch electrodes. Each of the second touch electrodes is formed by connecting in series a plurality of sub-electrodes insulated from the first touch electrodes, and two adjacent sub-electrodes in the same second touch electrode are respectively positioned on two sides of one of the first touch electrodes.

20 Claims, 4 Drawing Sheets

DISPLAY DEVICE, TOUCH PANEL AND MANUFACTURING METHOD THEREOF

CROSS REFERENCE

This application is based upon and claims priority to Chinese Patent Application No. 201711176018.7, filed on Nov. 22, 2017, the entire contents thereof are incorporated herein by reference.

TECHNICAL FIELD

The present disclosure relates to the field of touch technologies, and more particularly, to a display device, a touch panel and a method for manufacturing the touch panel.

BACKGROUND

With the development of touch technologies, touch panels have been widely used in a large number of electronic devices, making human-computer interaction more convenient. Existing touch panels generally include resistive touch panels and capacitive touch panels or the like. Among them, capacitive touch panels are widely used because of their wear resistance, low maintenance cost, and support for gesture recognition and multi-touch, etc. Mutual-capacitive touch panels are a type of very common capacitive touch panels.

SUMMARY

According to an embodiment of the present disclosure, there is provided a touch panel, which includes:
a substrate;
a plurality of first touch electrodes, arranged on the substrate; and
a plurality of second touch electrodes, arranged in a same layer as the first touch electrodes.

Each of the second touch electrodes comprises a plurality of sub-electrodes connected in series and insulated from the first touch electrodes, and two adjacent sub-electrodes in a same second touch electrode are respectively positioned on two sides of one of the first touch electrodes.

In an exemplary embodiment of the present disclosure, the substrate has a display area and a peripheral area positioned at a perimeter of the display area, and the peripheral area has a bonding area; and the touch panel further includes:
a plurality of first leads, each of the first touch electrodes being connected to the bonding area through each of the first leads in a one-to-one correspondence; and
a plurality of second leads, each of the sub-electrodes being connected to the bonding area through each of the second leads in a one-to-one correspondence, and the second leads connected to the sub-electrodes of the same second touch electrode being connected to the bonding area.

In an exemplary embodiment of the present disclosure, the touch panel further includes:
an organic light-emitting device, arranged on the substrate and positioned in the display area; and
a thin-film encapsulation layer, arranged on the organic light-emitting device, both the first touch electrodes and the second touch electrodes being arranged on the thin-film encapsulation layer and positioned in the display area.

In an exemplary embodiment of the present disclosure, the touch panel further includes:

a plurality of first via holes, arranged on the thin-film encapsulation layer and positioned in the peripheral area, each of the first leads being connected to the bonding area through each of the first via holes in a one-to-one correspondence; and
a plurality of second via holes, arranged on the thin-film encapsulation layer and positioned in the peripheral area, each of the second leads being connected to the bonding area through each of the second via holes in a one-to-one correspondence.

In an exemplary embodiment of the present disclosure, the sub-electrodes between two adjacent first touch electrodes are arranged in a staggered manner along an extension direction of the first touch electrodes.

In an exemplary embodiment of the present disclosure, a clearance is provided between any one of the first touch electrode and the sub-electrodes adjacent to the first touch electrode.

In an exemplary embodiment of the present disclosure, the touch panel further includes:
an insulating layer, arranged on the first touch electrodes and the second touch electrodes.

In an exemplary embodiment of the present disclosure, the insulating layer includes:
an inorganic layer, arranged on the first touch electrodes and the second touch electrodes; and
an organic layer, arranged on the inorganic layer.

In an exemplary embodiment of the present disclosure, the first direction is perpendicular to the second direction.

According to an aspect of the present disclosure, there is provided a method for manufacturing a touch panel, which includes:
providing a substrate; and
forming a plurality of first touch electrodes and second touch electrodes on the substrate, wherein the first touch electrodes and the second touch electrodes are arranged on the same layer.

Each of the second touch electrodes is formed by connecting in series a plurality of sub-electrodes insulated from the first touch electrodes, and two adjacent sub-electrodes in the same second touch electrode are respectively positioned on two sides of one of the first touch electrodes.

It should be understood that the above general description and the detailed description below are merely exemplary and explanatory, and do not limit the present disclosure.

BRIEF DESCRIPTION OF THE DRAWINGS

The accompanying drawings herein are incorporated in and constitute a part of this specification, illustrate embodiments conforming to the present disclosure and together with the description serve to explain the principles of the present disclosure. The accompanying drawings in the following description show merely some embodiments of the present disclosure, and persons of ordinary skill in the art may still derive other drawings from these accompanying drawings without creative efforts.

DETAILED DESCRIPTION

Figure 1:
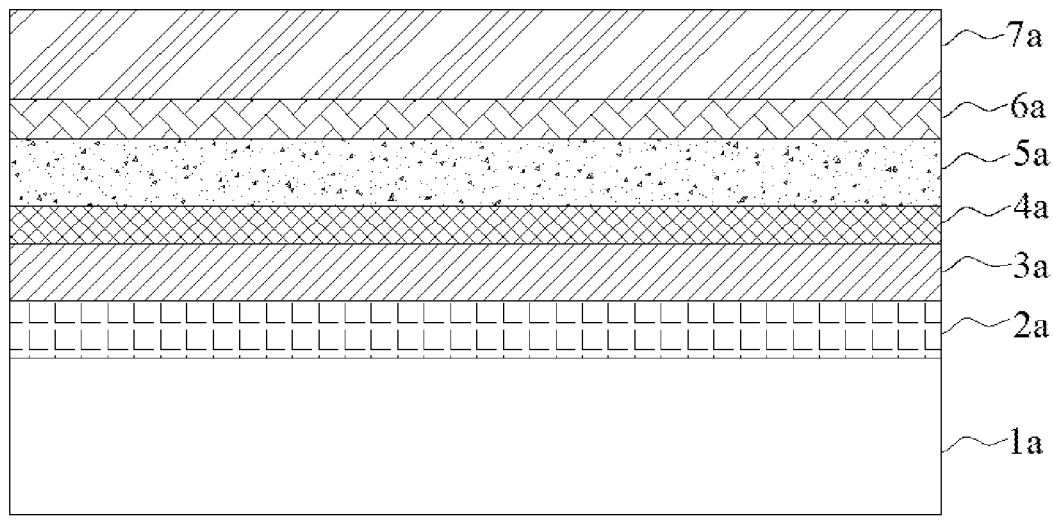
FIG. 1 schematically illustrates a schematic sectional view of a touch panel according to an example for a comparison.

Exemplary embodiments will be described more comprehensively by referring to accompanying drawings now. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and their detailed description will be omitted.

Although this specification uses relativity terms such as "above" and "below" to describe a relative relation between one component and another component in the drawings, these terms are merely for convenience of this specification, for example, the directions of the examples in the accompanying drawings. It is to be understood that when the devices in the drawings are turned upside down, components described as "above" will become components described as "below". When a certain structure is "above" other structures, it likely means that a certain structure is integrally formed on other structures, or a certain structure is "directly" arranged on other structures, or a certain structure is "indirectly" arranged on other structures by means of another structure.

The terms "one", "a", "the" and "said" are intended to mean that there exists one or more elements/constituent parts/etc. The terms "comprising" and "having" are intended to be open-ended and mean that there may be additional elements/constituent parts/etc. other than the listed elements/constituent parts/etc. Moreover, the terms "first" and "second" are used merely as labels, and are not intended to impose numerical limitations on their objects.

Figure 2:
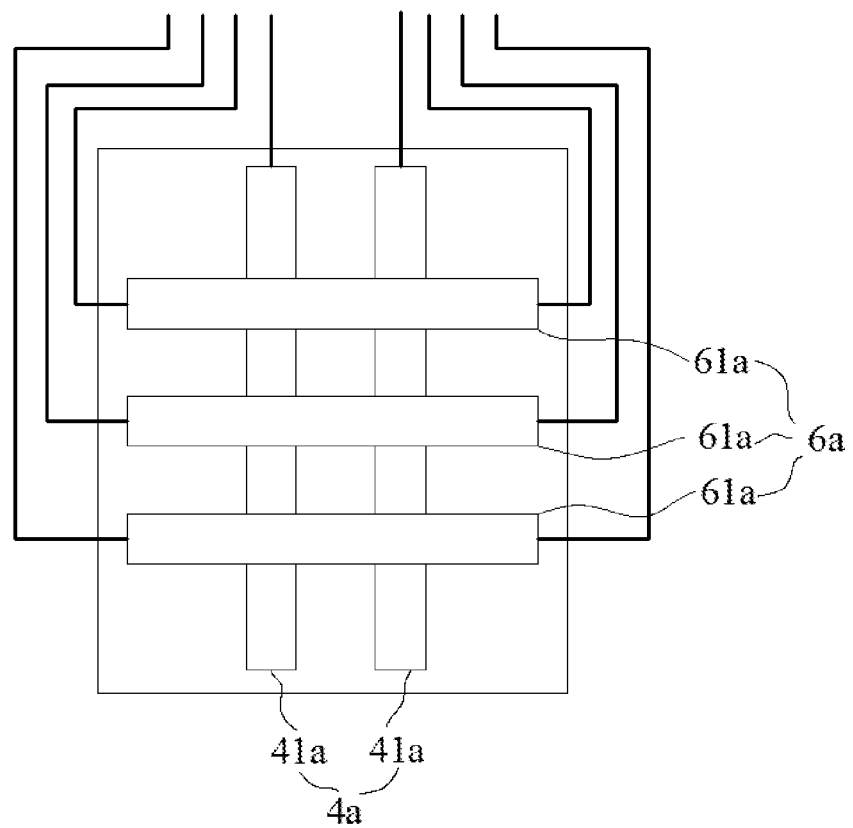
FIG. 2 schematically illustrates a schematic diagram of an arrangement mode of first electrodes and second electrodes of the touch panel according to the example for a comparison.

As shown in FIG. 1 and FIG. 2, a mutual-capacitive OLED touch panel is taken as an example, which generally includes a substrate 1a, an organic light-emitting device 2a, a thin-film encapsulation layer 3a, a first electrode layer 4a, an insulating layer 5a, a second electrode layer 6a and a protective layer 7a stacked successively from bottom to top. The location of a touch point may be determined by detecting the change in capacitance between the first electrode layer 4a and the second electrode layer 6a to implement the touch function. Meanwhile, the touch panel has a display area and a peripheral area at a perimeter of the display area, and the first electrode layer 4a and the second electrode layer 6a are connected to the peripheral area through wires and are bound so as to be connected to a drive circuit.

In this touch panel, as shown in FIG. 1, the first electrode layer 4a and the second electrode layer 6a are positioned in different layers and the insulating layer 5a is disposed therebetween, such that the overall thickness of the touch panel is larger, and manufacturing procedures are more, which are disadvantageous to reducing costs. Meanwhile, as shown in FIG. 2, an electrode 41a of the first electrode layer 4a and an electrode 61a of the second electrode layer 6a are wired from an end of the panel and extend outward, resulting in a wide perimeter of the touch panel due to wiring, which is disadvantageous to implementing a narrow bezel. In addition, to facilitate wiring, the first electrode layer 4a and the second electrode layer 6a generally are connected to different bonding areas respectively, which leads to a complicated overall structure.

It is to be noted that the above information disclosed is only for understanding of the present disclosure and therefore it may contain information that does not form the prior art that is already known to a person of ordinary skill in the art.

Figure 3:
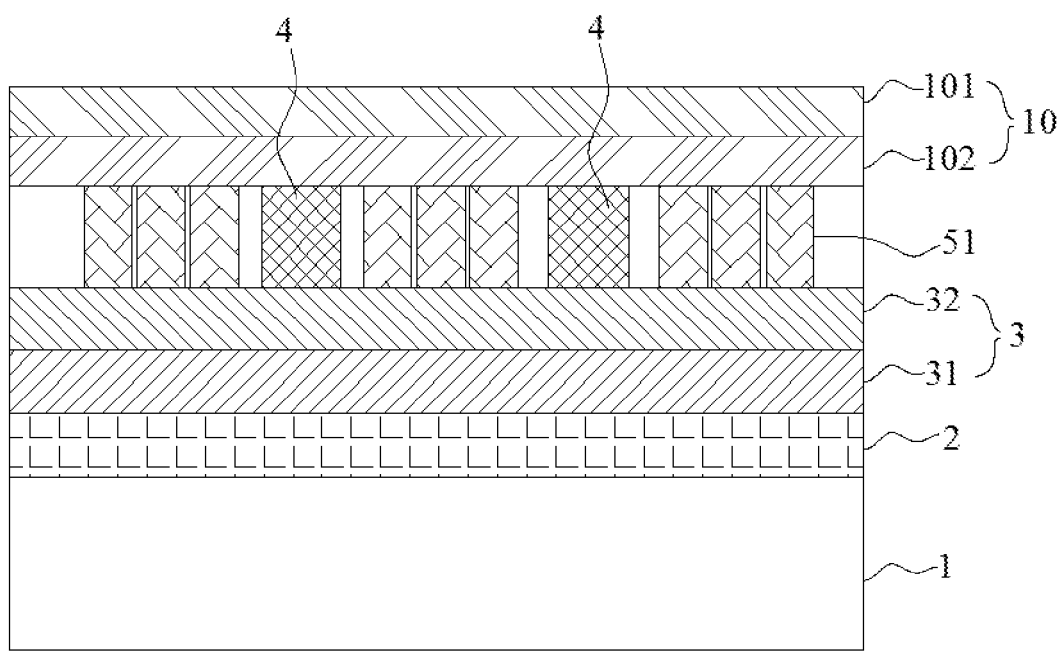
FIG. 3 schematically illustrates a schematic sectional view of a touch panel taken along line A-A' of FIG. 4 according to the present disclosure.

This exemplary embodiment provides a touch panel. As shown in FIG. 3, the touch panel in this exemplary embodiment may include a substrate 1, an organic light-emitting device 2, a thin-film encapsulation layer 3, first touch electrodes 4, and second touch electrodes 5.

In this exemplary embodiment, as shown in FIG. 3, the substrate 1 may be a transparent glass material such as borosilicate glass, etc. The substrate 1 may be shaped like a rectangle but is not limited thereto, and also may be a circle or other shapes, and no limitation is imposed on the size of the substrate 1. In the meanwhile, the substrate 1 may have a display area and a peripheral area positioned at a perimeter of the display area, the peripheral area may be provided with a bonding area that may be bound with a drive circuit board such as a flexible drive circuit board, etc.

In this exemplary embodiment, as shown in FIG. 3, the organic light-emitting device 2 may be positioned in the display area and may include a plurality of array-distributed organic light-emitting units. Each of the organic light-emitting units includes an anode, a cathode, and an organic material functional layer between the anode and the cathode. The anode typically is made from a transparent conductive material such as indium tin oxide (ITO), and the cathode may use a metal electrode such as magnesium-silver alloy, etc. Reference may be made to the structure of an organic light-emitting device of an existing OLED display device for the organic light-emitting device 2, and thus its detailed description is omitted herein.

In this exemplary embodiment, as shown in FIG. 3, the thin-film encapsulation layer 3 may be covered on the organic light-emitting device 2, and the thin-film encapsulation layer 3 may be a two-layer structure, including a stacked inorganic thin-film layer 31 and an organic thin-film layer 32. The inorganic thin-film layer 31 may be arranged on the organic light-emitting device 2, and the organic thin-film layer 32 may be arranged on the inorganic thin-film layer 31. Of course, in other exemplary embodiments of the present disclosure, the thin-film encapsulation layer 3 is not limited to the two-layer structure, and also may be a three-layer structure or a five-layer structure, etc. Taking the three-layer structure as an example, the thin-film encapsulation layer 3 may include at least one inorganic thin-film layer and at least one organic thin-film layer alternately arranged with respect to each other. Reference may be made to the existing thin-film encapsulation layer 3 for the specific structure and material of the thin-film encapsulation layer 3, and thus its detailed description is omitted herein.

Figure 4:
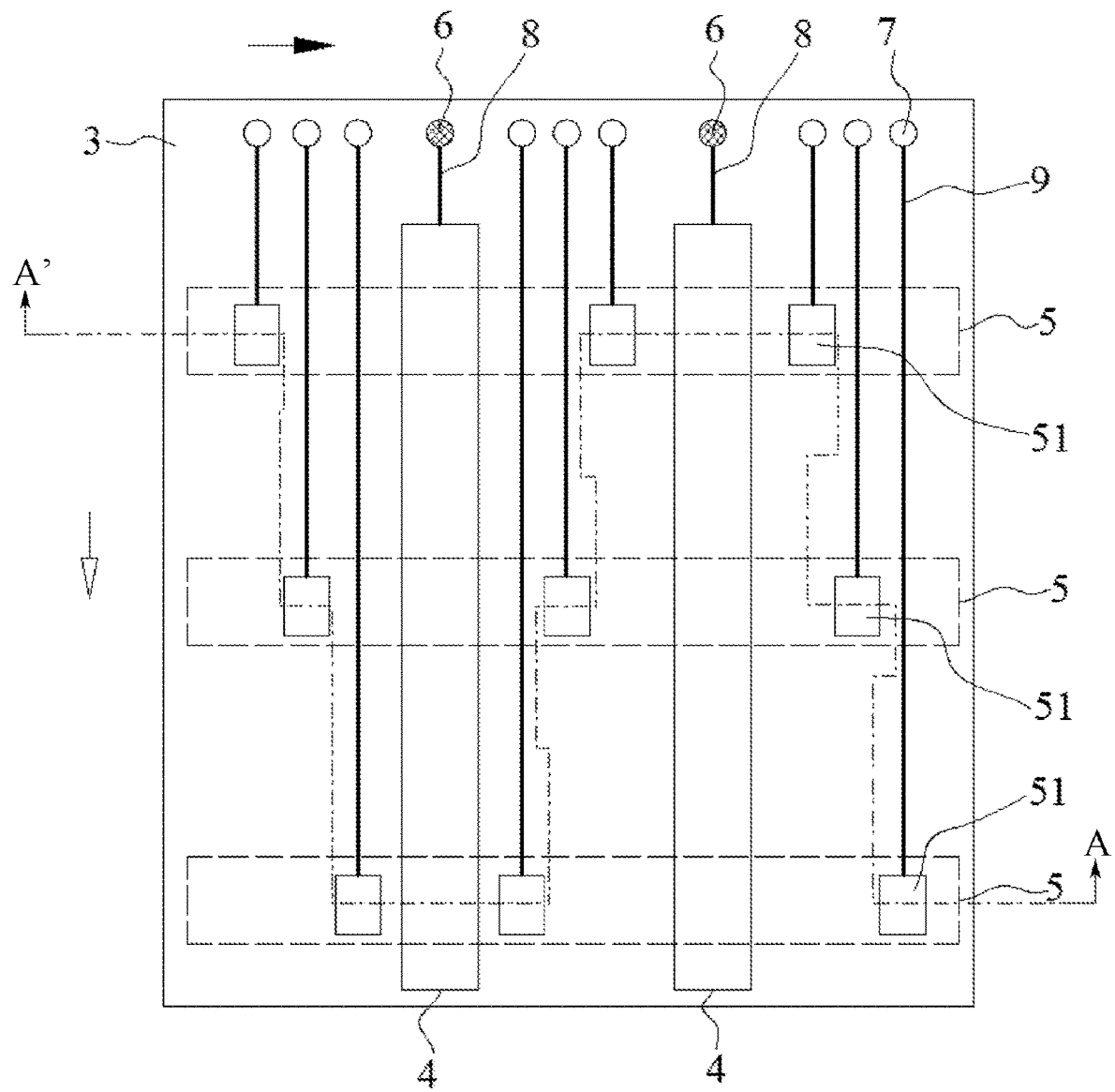
FIG. 4 schematically illustrates a schematic diagram of an arrangement mode of first touch electrodes and second touch electrodes of the touch panel according to the present disclosure.

In this exemplary embodiment, as shown in FIG. 3 and FIG. 4, the first touch electrode 4 may be shaped like a bar and its cross section may be shaped like a rectangle or the like. The number of the first touch electrodes 4 may be multiple, which may specifically depend on the size of the substrate 1 and is not particularly limited herein. A plurality of first touch electrodes 4 may be abreast or side by side distributed on the thin-film encapsulation layer 3 along a direction in parallel with a first direction, and positioned in the display area, wherein any two adjacent first touch electrodes 4 are parallel. No particular limitation is imposed on the first direction herein. For example, the first direction may be a direction in parallel with any side edge of the substrate 1 if the substrate is shaped like a rectangle. The direction as indicated by the solid arrow in FIG. 4 is the first direction. Furthermore, the materials of the first touch electrodes 4 may be transparent conductive materials such as indium tin oxide (ITO), etc. The first touch electrodes 4 may serve as touch drive electrodes.

In this exemplary embodiment, as shown in FIG. 3 and FIG. 4, the number of the second touch electrodes 5 may be multiple, which may specifically depend on the size of the substrate 1 and is not particularly limited herein. A plurality of second touch electrodes 5 may be abreast or side by side distributed on the thin-film encapsulation layer 3 along a direction in parallel with a second direction, and positioned in the display area. The second direction may be a direction intercrossed with respect to the first direction. For example, the second direction may be perpendicular to the first direction, wherein the direction as indicated by the hollow arrow in FIG. 4 is the second direction. Of course, the second direction and the first direction also may constitute a non-right angle.

As shown in FIG. 4, each of the second touch electrodes 5 may include a plurality of sub-electrodes 51, and the sub-electrodes 51 and the first touch electrodes 4 may be arranged on the same layer. A plurality of sub-electrodes 51 of the same second touch electrode 5 may be arranged and connected in series along a direction in parallel with the first direction. The sub-electrodes 51 within one dashed box in FIG. 4 are the sub-electrodes 51 belonging to the same second touch electrode 5. Each of the sub-electrodes 51 may be shaped like a square or a rectangle and the like, and no particular limitation is imposed on the shapes of the sub-electrodes 51 herein. For any second touch electrode 5, two adjacent sub-electrodes 51 may be separated at two sides of the same first touch electrode 4. That is, each sub-electrode 51 of the second touch electrode 5 and each of the first touch electrodes 4 are arranged at intervals, such that there is only one sub-electrode 51 of one second touch electrode 5 between two adjacent first touch electrodes 4. Moreover, each of the first touch electrodes 4 does not come into contact with its adjacent sub-electrodes 51. Therefore, any one of the first touch electrodes 4 is insulated from any one of the sub-electrodes 51. Thus, the location of a touch point may be determined by detecting the change in capacitance between the first touch electrodes 4 and the first sub-electrodes 51 of the second touch electrodes 5 to implement the touch function. The second touch electrodes may serve as touch sensing electrodes.

Moreover, a plurality of sub-electrodes 51 are arranged between two adjacent first touch electrodes 4, and these sub-electrodes 51 belong to a plurality of second touch electrodes 5 respectively. That is, one sub-electrode 51 of each of the second touch electrodes 5 is positioned between two adjacent first touch electrodes 4. As shown in FIG. 4, the sub-electrodes 51 between two adjacent first touch electrodes 4 may be arranged in a staggered manner along a direction in parallel with the second direction. That is, a plurality of sub-electrodes 51 between two adjacent first touch electrodes 4 are not in the same straight line for the convenience of wiring.

It is to be noted that FIG. 4 merely illustrates an arrangement mode of the first touch electrodes 4 and the second touch electrodes 5, wherein the sub-electrodes 51 on two sides of a first touch electrode 4 are symmetrical with respect to the first touch electrode 4. In other exemplary embodiments of the present disclosure, the first touch electrodes 4 and the second touch electrodes 5 also may adopt other arrangement modes.

Figure 5:
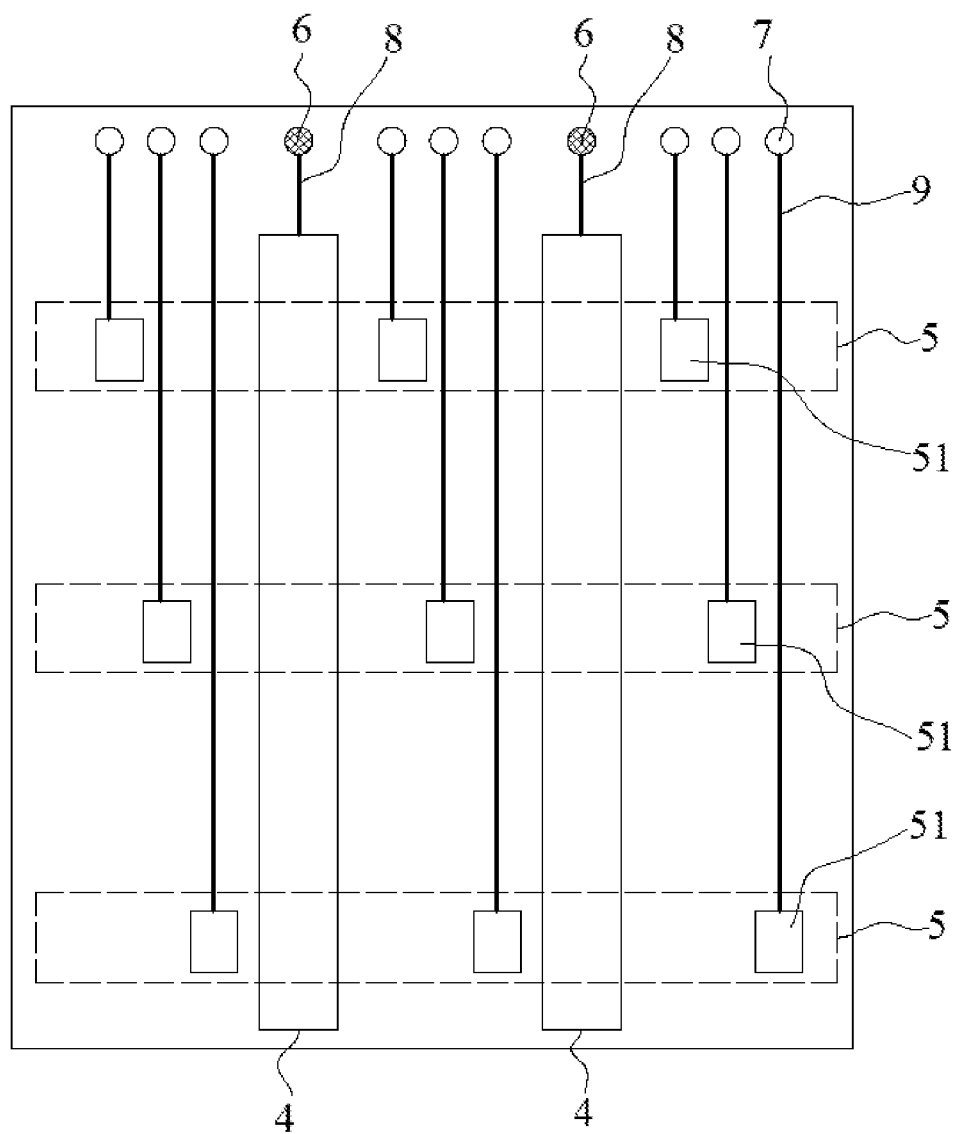
FIG. 5 schematically illustrates a schematic diagram of another arrangement mode of the first touch electrodes and the second touch electrodes of the touch panel according to the present disclosure.

For example, as shown in FIG. 5, FIG. 5 illustrates a third arrangement mode of the first touch electrodes 4 and the second touch electrodes 5, wherein the sub-electrodes 51 on two sides of a first touch electrode 4 may be distributed in the same pattern. Moreover, the sub-electrodes 51 on two sides of the first touch electrode 4 also may be in a linear distribution, and the detailed description is omitted herein.

As shown in FIG. 4, the touch panel of this exemplary embodiment may further include first via holes 6 and second via holes 7.

The number of the first via holes 6 may be multiple, and the specific number of the first via holes 6 may be equal to that of the first touch electrodes 4. A plurality of first via holes 6 may be arranged on the thin-film encapsulation layer 3 and positioned in the peripheral area, and may be connected to the bonding area.

The number of the second via holes 7 may be multiple, and the specific number of the second via holes 7 may be equal to that of the sub-electrodes 51. A plurality of second via holes 7 may be arranged on the thin-film encapsulation layer 3 and positioned in the peripheral area, and may be connected to the bonding area.

In other exemplary embodiments of the present disclosure, the number of the second via holes 7 also may be equal to that of the second touch electrodes 5. A plurality of second leads 9 connecting the sub-electrodes 51 of the same second touch electrode 5 may be connected in series in the peripheral area and then connected to the bonding area through one second via hole 7.

As shown in FIG. 4, the touch panel of this exemplary embodiment may further include first leads 8 and second leads 9.

The number of the first leads 8 may be multiple, and the specific number of the first leads 8 may be equal to that of the first touch electrodes 4. A plurality of first leads 8 and the first touch electrodes 4 may be arranged on the same layer and connected respectively, and each of the first leads 8 may extend from the display area to the peripheral area. Any first lead 8 and the first touch electrodes 4 connected thereto may be positioned on the same straight line. The part of the first lead 8 positioned in the display area may be connected to a plurality of first touch electrodes 4 respectively, and the part of the first lead 8 positioned in the peripheral area may be connected to the bonding area respectively through a plurality of first via holes 6, such that the first lead 8 may be connected to a drive circuit board through the bonding area.

The number of the second leads 9 may be multiple, and the specific number of the second leads 9 may be equal to that of the sub-electrodes 51 of the second touch electrodes 5. A plurality of second leads 9 and the second touch electrodes 5 may be arranged on the same layer, and may extend from the display area to the peripheral area. The part of the second lead 9 positioned in the display area may be connected to a plurality of sub-electrodes 51 respectively, and the part of the second lead 9 positioned in the peripheral area may be connected to the bonding area respectively through a plurality of second via holes 7. According to one embodiment, in the bonding area, the sub-electrodes 51 belonging to the same second touch electrodes 5 are connected in series, and may be connected to a drive circuit board through the bonding area. According to another embodiment, in the bonding area, the sub-electrodes 51 belonging to the same second touch electrodes 5 are not connected to each other, and may be connected to a drive circuit board through the bonding area.

The first touch electrodes 4 and the second touch electrodes 5 may be connected to the same bonding area, which may be connected to (e.g., bound with) a drive circuit. Thus, a touch signal may be transmitted to the drive circuit board through the second touch electrodes 5 and the first touch electrodes 4, and the drive circuit board processes the touch signal to determine information such as a touch location so as to implement the touch function. In this process, the first touch electrodes 4 and the second touch electrodes 5 may be driven by means of the same drive circuit board and the same bonding area. Therefore, it is avoidable that the first touch electrodes 4 and the second touch electrodes 5 are connected to different bonding areas, which is advantageous to simplifying structures and fabrication processes. Moreover, the drive circuit board and the bonding area also may be configured to drive the organic light-emitting device 2 so as to further simplify structures. Specifically, for example, "connected to the bonding area" in this application means connected to one or more pads on preset positions of the bonding area according to needs.

As shown in FIG. 3, the touch panel of this exemplary embodiment may further include an insulating layer 10 which may be an insulating material. The insulating layer 10 may be arranged on the first touch electrodes 4 and the second touch electrodes 5 and may cover the first touch electrodes 4 and the second touch electrodes 5.

The insulating layer 10 may be of a two-layer structure and may include an inorganic layer 101 and an organic layer 102.

The inorganic layer 101 may cover on the first touch electrodes 4 and the second touch electrodes 5, and material of the inorganic layer 101 may be aluminum oxide, zinc oxide or silicon dioxide, but is not limited thereto. The material of the inorganic layer 101 also may be silicon nitride or the like. Of course, the material of the inorganic layer 101 also may be a combination of a variety of materials, which are not enumerated herein. In the meanwhile, the inorganic layer 101 may be formed by using a chemical vapor deposition method or an atomic layer deposition method.

The organic layer 102 is arranged on the inorganic layer 101, and a material thereof may be epoxy resin or polyvinyl alcohol but is not limited thereto. The material of the organic layer 102 also may be a urethane acrylate polymer or polyimide resin and so on. Of course, the material of the organic layer 102 also may be a combination of a variety of materials, which are not enumerated herein. In the meanwhile, the organic layer 102 may be formed by way of macromolecular monomer deposition, chemical vapor deposition or inkjet printing, etc.

In other exemplary embodiments of the present disclosure, the insulating layer 10 may be of a single-layer structure and also may be of a structure having three or even more layers, which are not enumerated herein.

In conclusion, in the touch panel of this exemplary embodiment, the second touch electrodes 5 and the first touch electrodes 4 are arranged on the same layer, such that the insulating layer between the second touch electrodes 5 and the first touch electrodes 4 may be omitted, thereby reducing the thickness of the touch panel, simplifying the structures and reducing the fabrication procedures. In the meanwhile, the first touch electrodes 4 and the second touch electrodes 5 may be connected to the same bonding area, thereby reducing the number of the bonding areas and further simplifying the structures and processes. Each of the second touch electrodes 5 is formed by a plurality of sub-electrodes 51 connected in series, and two adjacent sub-electrodes 51 in the same second touch electrode 5 are respectively positioned on two sides of one of the first touch electrodes 4, such that the location of a touch point may be determined by detecting the change in capacitance between the first touch electrodes 4 and the sub-electrodes 51 to implement the touch function. In the meanwhile, the first touch electrodes 4 and each of the sub-electrodes 51 may be drawn out through leads in parallel with the second direction to reduce areas around the touch panel where the leads are arranged, which is advantageous to implementing a narrow bezel design of the touch panel.

An exemplary embodiment of the present disclosure provides a method for manufacturing a touch panel, which may be used for manufacturing any one of the above touch panels, for example, the touch panel as shown in FIG. 3. The method for manufacturing a touch panel of this exemplary embodiment may include following steps.

In Step S110, a substrate is provided.

In Step S120, a plurality of first touch electrodes 4 and second touch electrodes 5 are formed on the substrate. The first touch electrodes 4 and the second touch electrodes 5 are arranged on the same layer, the first touch electrodes 4 are parallel to a first direction, and the second touch electrodes 5 are parallel to a second direction intersecting with the first direction.

Each of the second touch electrodes 5 is formed by connecting in series a plurality of sub-electrodes 51 insulated from the first touch electrodes 4, and two adjacent sub-electrodes 51 in the same second touch electrode 5 are respectively positioned on two sides of one of the first touch electrodes 4.

It is to be noted that the method for manufacturing a touch panel according to this exemplary embodiment may include a step of forming the organic light-emitting device 2 and the thin-film encapsulation layer 3 and a step of forming the insulating layer 10. In the meanwhile, a step of flattening may be added between the two steps, reference may be made to methods of corresponding portions in the prior art, and thus its detailed descriptions are omitted herein.

In the above Step S120, the first touch electrodes 4 and the second touch electrodes 5 may be formed through one patterning process, which may include steps of depositing a touch metal layer, coating a photoresist, exposing, developing and etching or the like, reference may be made to the existing patterning processes, and their detailed descriptions are omitted herein. The step of forming the touch metal layer may be implemented by means of chemical vapor deposition, evaporation or ion plating and so on, but is not limited thereto. Of course, the touch electrode layer may be formed by means of laser engraving, printing and so on, not enumerated herein.

The method for manufacturing a touch panel according to this exemplary embodiment may be used for manufacturing any one of the above touch panels. Therefore, reference may be made to beneficial effects of the above touch panels for the beneficial effects of the method for manufacturing a touch panel according to this exemplary embodiment, and thus their detailed descriptions are omitted herein.

An exemplary embodiment of the present disclosure also provides a display device, which may include the touch panel according to any one of the above exemplary embodiments. Reference may be made to the beneficial effects of the above touch panels for the beneficial effects of the display device according to this exemplary embodiment, and thus their detailed descriptions are omitted herein.

Other embodiments of the present disclosure will be apparent to those skilled in the art from consideration of the specification and practice of the invention disclosed here. This application is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A touch display panel, comprising:
   a substrate;
   a plurality of first touch electrodes, arranged on the substrate; and
   a plurality of second touch electrodes, arranged in a same layer as the plurality of first touch electrodes;
   wherein each of the second touch electrodes comprises a plurality of sub-electrodes connected in series and insulated from the plurality of first touch electrodes, and two adjacent sub-electrodes in a same second touch electrode are respectively positioned on two sides of one of the plurality of first touch electrodes and are symmetrical with respect to said one of the plurality of first touch electrodes; and
   wherein the substrate has a display area and a peripheral area positioned at a perimeter of the display area, and the peripheral area has a bonding area; and the touch panel further comprises:
   a plurality of first leads, each of the first touch electrodes being connected to the bonding area through each of the first leads in a one-to-one correspondence;
   a plurality of second leads, each of the sub-electrodes being connected to the bonding area through each of the second leads in a one-to-one correspondence,
   wherein the plurality of first touch electrodes are arranged side by side in a first direction and extend in a second direction, the first direction intersects with the second direction; and
   the plurality of second touch electrodes are arranged side by side in the second direction and extend in the first direction;
   wherein the plurality of first leads extend in the second direction in the display area, and the plurality of second leads extend in the second direction in the display area,
   wherein the sub-electrodes arranged between adjacent first touch electrodes are not overlapped with each other in the second direction.

2. The touch display panel according to claim 1, wherein the plurality of first leads and the plurality of second leads are connected to the bonding area which is only present on one side of the peripheral area.

3. The touch display panel according to claim 2, wherein a clearance is provided between any one of the first touch electrodes and the sub-electrodes adjacent to the any one of the first touch electrodes.

4. The touch display panel according to claim 1, further comprising:
   an organic light-emitting device, arranged on the substrate and positioned in the display area;
   a thin-film encapsulation layer, arranged on the organic light-emitting device, both the plurality of first touch electrodes and the plurality of second touch electrodes being arranged on the thin-film encapsulation layer and positioned in the display area,
   a plurality of first via holes, arranged on the thin-film encapsulation layer and positioned in the peripheral area, each of the first leads being connected to the bonding area through each of the first via holes in a one-to-one correspondence; and
   a plurality of second via holes, arranged on the thin-film encapsulation layer and positioned in the peripheral area, the plurality of second leads connecting the sub-electrodes of the same second touch electrode are connected to the bonding area through the same second via hole.

5. The touch display panel according to claim 4, wherein the thin-film encapsulation layer comprises an inorganic thin-film layer and an organic thin-film layer, wherein the inorganic thin-film layer is arranged on the organic light-emitting device, and the organic thin-film layer is arranged on the inorganic thin-film layer.

6. The touch display panel according to claim 1, wherein the sub-electrodes between two adjacent first touch electrodes are arranged in a staggered manner along an extension direction of the plurality of first touch electrodes.

7. The touch display panel according to claim 1, wherein the sub-electrodes on two sides of each of the first touch electrodes are distributed in a same pattern along an extension direction of the plurality of first touch electrodes.

8. The touch display panel according to claim 1, wherein a clearance is provided between any one of the first touch electrodes and the sub-electrodes adjacent to the any one of the first touch electrodes.

9. The touch display panel according to claim 1, further comprising:
   an insulating layer, arranged on the plurality of first touch electrodes and the plurality of second touch electrodes.

10. The touch display panel according to claim 9, wherein the insulating layer comprises:
    an inorganic layer, arranged on the plurality of first touch electrodes and the plurality of second touch electrodes; and
    an organic layer, arranged on the inorganic layer.

11. The touch display panel according to claim 1, wherein the first direction is perpendicular to the second direction.

12. A display device, comprising the touch display panel according to claim 1.

13. The touch display panel according to claim 1, wherein the plurality of first leads and the plurality of the second leads are arranged in the layer where the plurality of the first touch electrodes and the plurality of the second touch electrodes are arranged.

14. A method for manufacturing a touch display panel, comprising:
    providing a substrate; and
    forming a plurality of first touch electrodes and a plurality of second touch electrodes on the substrate, the plurality of first touch electrodes and the plurality of second touch electrodes being arranged on a same layer;
    wherein each of the second touch electrodes is formed by connecting in series a plurality of sub-electrodes insulated from the plurality of first touch electrodes, and two adjacent sub-electrodes in a same second touch electrode are respectively positioned on two sides of one of the first touch electrodes and are symmetrical with respect to said one of the plurality of first touch electrodes, and
    wherein the substrate has a display area and a peripheral area positioned at a perimeter of the display area, and the peripheral area has a bonding area; and the touch panel further comprises:

a plurality of first leads, each of the first touch electrodes being connected to the bonding area through each of the plurality of first leads in a one-to-one correspondence; and a plurality of second leads, each of the sub-electrodes being connected to the bonding area through each of the second leads in a one-to-one correspondence, wherein the plurality of first touch electrodes are arranged side by side in a first direction and extend in a second direction, the first direction intersects with the second direction; and the plurality of second touch electrodes are arranged side by side in the second direction and extend in the first direction;

wherein the plurality of first leads extend in the second direction in the display area, and the plurality of second leads extend in the second direction in the display area, wherein the sub-electrodes arranged between adjacent first touch electrodes are not overlapped with each other in the second direction.

15. The method according to claim 14, wherein the plurality of first leads and the plurality of second leads are connected to the bonding area which is only present on one side of the peripheral area.

16. The method according to claim 14, wherein the touch display panel further comprises:

an organic light-emitting device, arranged on the substrate and positioned in the display area;

a thin-film encapsulation layer, arranged on the organic light-emitting device, both the plurality of first touch electrodes and the plurality of second touch electrodes being arranged on the thin-film encapsulation layer and positioned in the display area, a plurality of first via holes, arranged on the thin-film encapsulation layer and positioned in the peripheral area, each of the first leads being connected to the bonding area through each of the first via holes in a one-to-one correspondence; and a plurality of second via holes, arranged on the thin-film encapsulation layer and positioned in the peripheral area, the plurality of second leads connecting the sub-electrodes of the same second touch electrode are connected to the bonding area through the same second via hole.

17. The method according to claim 14, wherein the sub-electrodes between two adjacent first touch electrodes are arranged in a staggered manner along an extension direction of the plurality of first touch electrodes.

18. The method according to claim 14, wherein the sub-electrodes on two sides of each of the first touch electrodes are distributed in a same pattern along an extension direction of the plurality of first touch electrodes.

19. The method according to claim 14, wherein the touch display panel further comprises:

an insulating layer, arranged on the plurality of first touch electrodes and the plurality of second touch electrodes.

20. The method according to claim 19, wherein the insulating layer comprises:

an inorganic layer, arranged on the plurality of first touch electrodes and the plurality of second touch electrodes; and an organic layer, arranged on the inorganic layer.

* * * * *